United States Patent [19]

Avedissian et al.

[11] Patent Number: 4,667,870
[45] Date of Patent: May 26, 1987

[54] REGISTERING ARTICLES TO SITES WITH RECESSED ULTRASONIC BONDING TOOL HEAD

[75] Inventors: Michael K. Avedissian, Mohnton; Earl D. Hertzog, Reading, both of Pa.

[73] Assignees: American Telephone and Telegraph Company; AT&T Technologies, Inc., both of Berkeley Heights, N.J.

[21] Appl. No.: 877,463

[22] Filed: Jun. 23, 1986

Related U.S. Application Data

[63] Continuation of Ser. No. 652,387, Sep. 20, 1984, abandoned.

[51] Int. Cl.$^4$ ............................................. B23K 1/06
[52] U.S. Cl. .................................... 228/103; 228/1.1; 228/6.2
[58] Field of Search ..................... 228/1.1, 44.3, 110, 228/6.2, 180.2; 269/21; 294/64.1; 29/840, 740

[56] References Cited

U.S. PATENT DOCUMENTS

| | | | |
|---|---|---|---|
| 255,318 | 6/1880 | Bakkeren | D8/30 |
| 3,101,634 | 8/1963 | Cooper | 78/82 |
| 3,149,510 | 9/1964 | Kulicke | 228/6.2 |
| 3,257,721 | 6/1966 | Jones | 29/470.1 |
| 3,695,502 | 10/1972 | Gaiser | 228/4 |
| 3,700,155 | 10/1972 | Hermanns | 228/1.1 |
| 3,901,749 | 8/1975 | Howells | 156/73.3 |
| 3,912,153 | 10/1975 | Hartleroad | 228/6.2 |
| 3,924,791 | 12/1975 | Shimizu | 228/110 |
| 3,934,783 | 1/1976 | Larrison | 228/110 |
| 4,063,673 | 12/1977 | Gaicki | 228/1 |

OTHER PUBLICATIONS

V. T. Ho et al., article entitled "Ultrasonic Bonding Tip," IBM Technical Disclosure Bulletin, vol. 10, No. 12, May 1968.

Primary Examiner—Nicholas P. Godici
Assistant Examiner—G. M. Reid
Attorney, Agent, or Firm—Wendy W. Koba

[57] ABSTRACT

A head (158) precisely registers an article (10) to a site for operations such as bonding. The article (10) may be an electronic chip (10) containing a plurality of sides (12-15) having top edges for engaging the head (158) and bottom edges for registering to a topside (95) of a pedestal (20). A body (161) has an upper portion adapted for support and a lower portion terminating in a downwardly presented, working face (159). Face 159 includes a cavity (166) formed by walls (167-170) having inwardly and upwardly directed surfaces (171-174) for engaging corresponding top edges of the chip (10). The chip (10) is at least partially disposed within the cavity (166) making it difficult for an operator to see, especially when a fixed microscope is required for viewing. A bore (175) communicates with the cavity (166) and may be connected to a vacuum source for drawing a chip (10) into the cavity and for removably engaging the same to the engaging surfaces (171-174). Preferably, the front wall (168), facing the operator, has recessed end portions (100 and 102). Such recesses (100 and 102) reveal, preferbly extending to corners, bottom edges of the engaged chip (10) sufficient for registering such edges and the chip (10) to the topside (95) of the pedestal (20).

13 Claims, 14 Drawing Figures

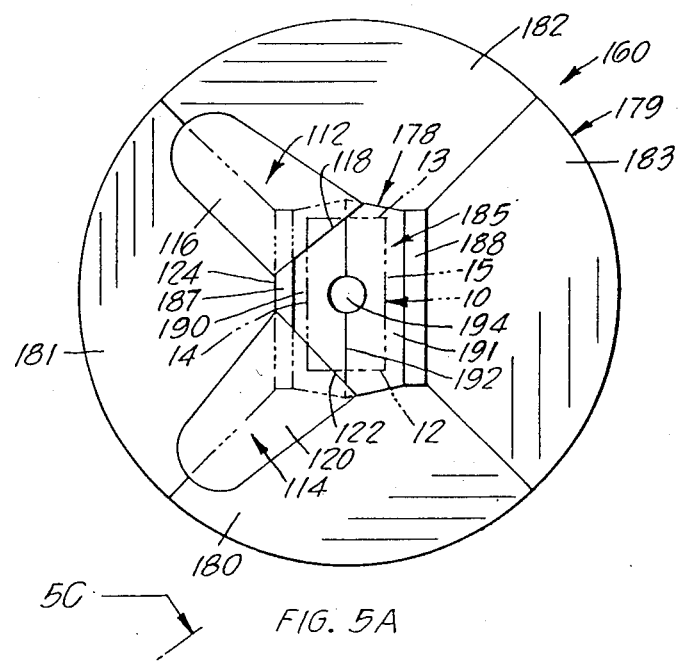
FIG. 5A
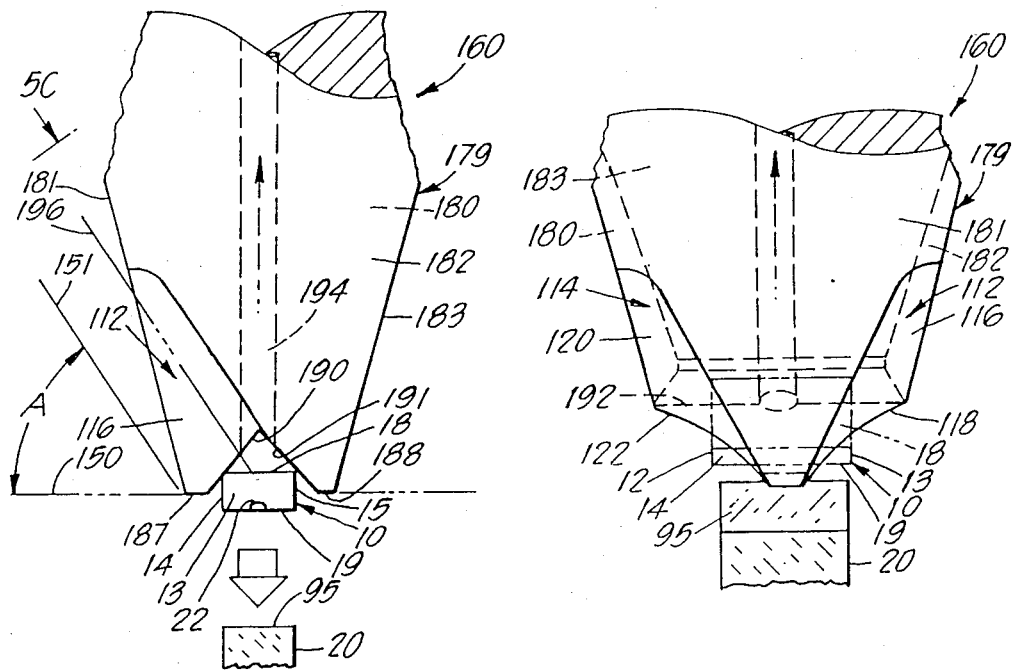
FIG 5B
FIG 5C

REGISTERING ARTICLES TO SITES WITH RECESSED ULTRASONIC BONDING TOOL HEAD

This is a continuation of application Ser. No. 652,387, filed Sept. 20, 1984, now abandoned.

TECHNICAL FIELD

This invention relates to registering an article to a site. More particularly, this invention relates to bonding expedients including a head for holding an electronic chip such that edges are revealed for registering to a site.

BACKGROUND OF THE INVENTION

Miniature articles are difficult to handle, especially when precise registration of an article to a site is required. The problem is exemplified in the solid state electronics industry with respect to thin, rectangular or square, semiconductor chips having relatively flat, major surfaces. Such chips are handled during separation from a wafer, during testing and when they are assembled into a service package. Precise registration to a site is typically desired for testing and often demanded for bonding assemblies. A problem is that a top, active surface of most chips has delicate, electronic features constructed therein which are vulnerable to damage by mechanical contact of a pickup tool.

Early expedients for registering such chips to a site included vacuum powered probes which lightly contacted an active surface of a chip. Orientation of a chip was difficult to achieve and maintain and the contact sometimes damaged features in an active surface. Chips were typically bonded by applying a body of solder to a site, positioning a chip upon the solder and heating the site to reflow the solder. A problem was that the solder interfered with precise registration of a chip to a site. Another problem was that a resulting intermediate layer of solder sometimes slowed a desired drain of operating heat away from a chip.

A desirable expedient for handling a chip without contacting an active surface is to utilize a vacuum head having a cavity in a downwardly presented working face. Top edges of a chip become engaged by vacuum to inwardly and upwardly inclined surfaces on walls of the cavity to achieve and maintain a desired orientation. Such walls also provide sufficient lateral restraint that a pickup head may be utilized for improved bonding. For example, the head may be coupled to an ultrasonic vibrator to achieve bonding with or without externally applied heat and without solder. A problem is that registration is achieved by comparing lateral features of a chip to a site, and the cavity walls typically obscure at least one-half of a chip viewed along a workplane extending across the working face of a head.

Another problem is that solid state chips now range downwardly to sizes so small that major magnification and mechanical manipulation are often required for registration to a site. A problem with such magnification is that an operator's viewing field is restricted by a required fixing of a microscope (including at least one eyepiece) in space. The manipulation is performed while one is viewing through the eyepiece at a considerable height above the workplane of a head. One sees an oblique, foreshortened view of the head and the chip is typically, completely hidden from the viewing field. Consequently, a position of a chip in a cavity is estimated relative to viewable head features. Such estimated position is compared to a site by observing the viewable head features rather than by comparing the chip edges directly to a site. The registration achievable by such relative comparing is too imprecise for many of today's assembly operations.

Accordingly, it is desirable to develop new and improved pickup heads for registering articles, including solid state chips, to sites. Such heads should reveal at least some bottom edges of a chip, preferably extending to corners facing an operator for such registration. As applied to bonding apparatus, such heads should resist forces experienced in ultrasonically bonding a chip to a heat conductive site on a pedestal or other substrate.

SUMMARY OF THE INVENTION

Expedients such as an improved head are provided for registering an article to a site. Preferably the head is adapted for bonding an article such as a solid state chip to a site. Such a chip has a plurality of sides including top edges for engaging the head and bottom edges for registering to the site.

In one embodiment, a body is provided with an upper portion adapted for support and a lower portion terminating in a downwardly presented, working face.

In such face, a cavity is formed by a plurality of walls having inwardly and upwardly directed surfaces for engaging top edges of a chip. By such engagement, the chip may achieve a desired orientation with at least a portion disposed within the cavity and a portion exposed to view.

In another embodiment, relative motion is produced between the body and the chip to align a free chip to the cavity. The aligned chip is drawn into the cavity and removably engaged to the engaging surfaces, preferably utilizing a vacuum source communicating with the cavity through a bore in the body.

In another embodiment, lateral features of the chip are compared with lateral features of the site. Such comparing is advantageously facilitated by at least one recess formed in a wall of the cavity. For some chips, it is preferred to have recesses formed at two end portions of a wall facing an operator. Such recesses reveal bottom edges of an engaged chip, preferably extending to corners, for comparing and registering a chip to a site.

BRIEF DESCRIPTION OF THE DRAWING

The invention will be more readily understood from the following detailed description when read in conjunction with the drawing wherein:

FIG. 5A is a bottom view of a head such as that shown in FIG. 3, including modifications made in the working face in accordance with one embodiment of the invention;

FIG. 5B is a side elevation of the head shown in FIG. 5A when such head is supported upright for bonding;

FIG. 5C is an operator's view of the head shown in FIGS. 5A and 5B (taken along line 5C—5C in FIG. 5B), illustrating improved viewing of an article;

Figure 1:
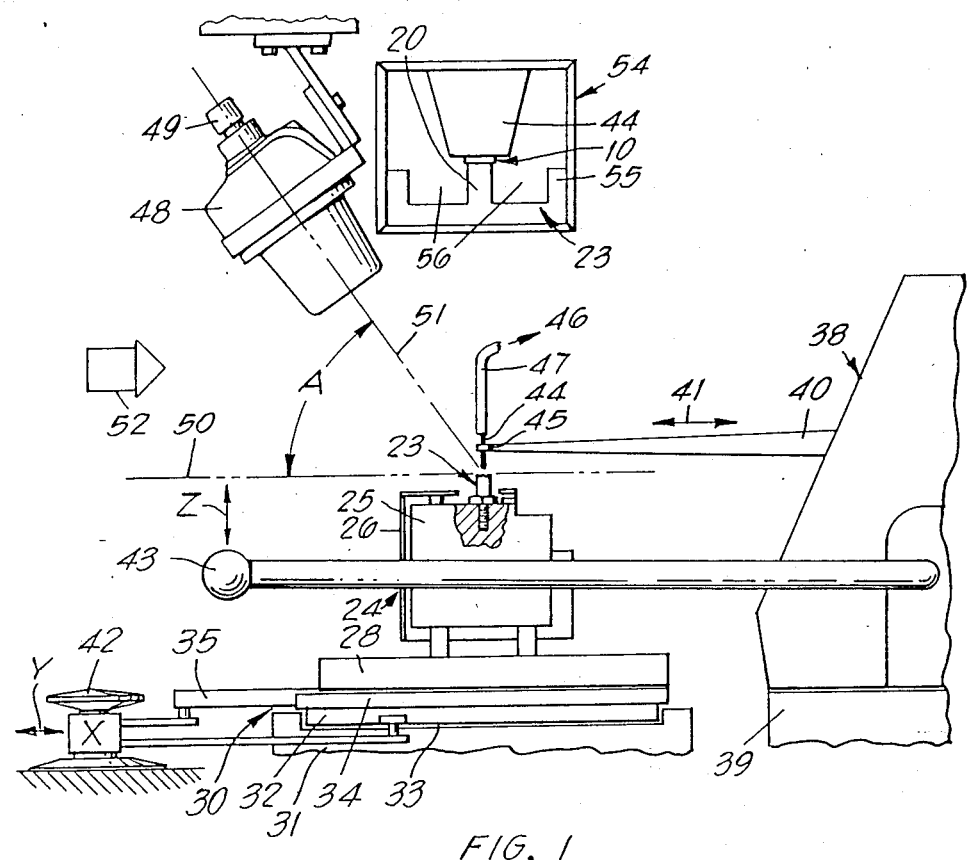
FIG. 1 is an elevation view of typical apparatus for registering and bonding chips to sites during which viewing problems may be solved in accordance with the invention.

Some of the elements in the figures are abbreviated or simplified to highlight features of the invention. Also, where appropriate, reference numerals have been repeated in the figures to designate the same or corresponding features in the drawing.

DETAILED DESCRIPTION

The Articles

FIGS. 1-6B show a typical article 10 (or outline thereof) which may be registered to a site in the practice of the invention. Such an article will be described herein primarily with respect to solid state (usually semiconductor) chips and more particularly with respect to a laser chip, designated generally as a chip 10. Solid state chips are typically rectangular or square and are flat because they are cut from wafers which are polished to achieve a high degree of planarity on major surfaces. Then electronic features are typically processed into an active major surface and another, nearly parallel, inactive major surface is utilized for support. The active surface is typically vulnerable to damage from mechanical contact although both surfaces may be vulnerable depending on the construction and the material of the chip.

The large majority of electronic chips are made from silicon and they are relatively sturdy except for the typically delicate active surface. Some silicon chips have polysilicon tubs isolated by oxide layers and such chips are fragile. Chips made from gallium arsenide and indium phosphide for optical and other devices are typically very brittle. Consequently, there is a need for heads to pick up and handle nearly all solid state chips without mechanical contact to surfaces or undue strain on the chip construction.

The illustrative chip 10 was chosen as a laser chip primarily because of tho precise registration required during its assembly to other components. A laser chip 10 is typically made from brittle compounds so it is vulnerable to stress and surface abrasion, typical of the solid state chips as a group.

Figure 2A:
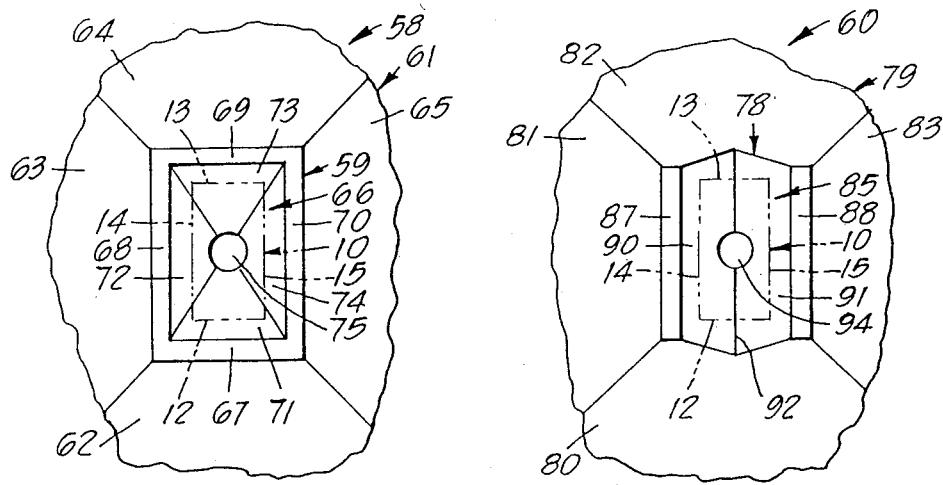
FIG. 2A is a bottom view of a prior art bonding head showing its working face.
Figure 2B:
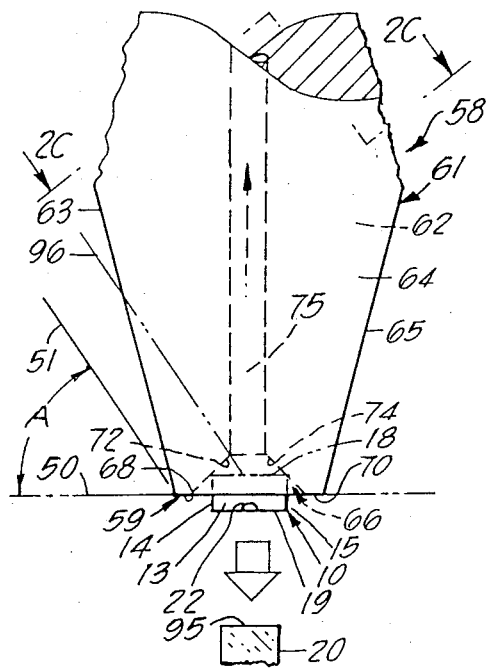
FIG. 2B is a side elevation of the head shown in FIG. 2A when such head is supported upright for bonding.
Figure 4A:
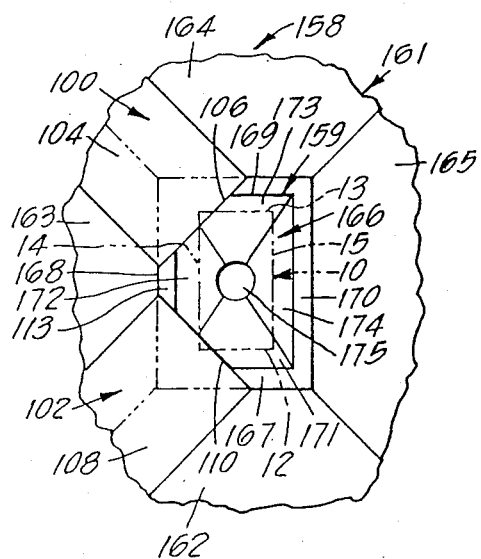
FIG. 4A is a bottom view of a head such as that shown in FIGS. 2A, 2B and 2C, including modifications made in the working face in accordance with one embodiment of the invention.
Figure 4B:
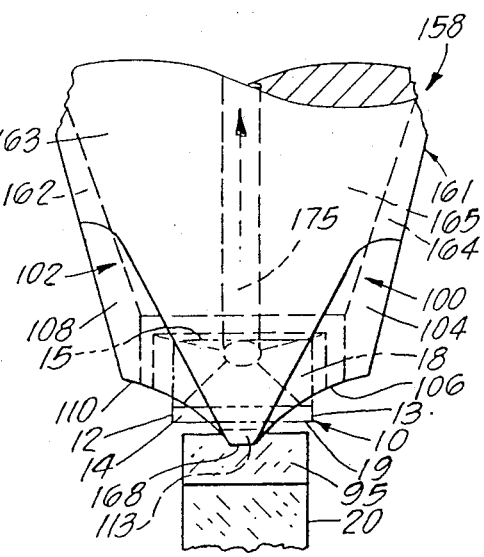
FIG. 4B is an operator's view of the head shown in FIG. 4A, illustrating improved viewing of an article.

Referring to FIGS. 2B and 4B concurrently, a chip 10 includes short sides 12 and 13 having widths of about eight and one-half mils (0.22 mm), long sides 14 and 15 having lengths of about fifteen mils (0.38 mm) and a finished thickness of only about four mils (0.10 mm). A top surface 18 typically has metallized layers for ohmic contact making such surface vulnerable to abrasion. A bottom surface 19 is typically formed with a gold pad (not shown) for bonding to a heat conductive site such as on a pedestal 20 (to be more fully described later). Within a bottom portion of chip 10, there is formed a light producing structure (not shown) having light emitting windows 22 (only one shown in FIG. 2B) in each of the short sides of the chip 10. Because the windows are at the bottom of chip 10, it is intended to mount such chip so the short sides 12 and 13 will overhang pedestal 20 by about one-half mil (0.01 mm).

Although laser chip 10 has been selected for illustration and description, it is to be understood that the invention is not so limited. Many of the problems seen in registering a laser chip 10 to a site are similar to, although often more difficult than, the problems seen in registering other solid state chips which may also be registered according to the invention. For example, most chips range from about 1 mm to about 10 mm on a side and from about 0.4 mm to about 0.8 mm in thickness. Chip 10 is about 0.22 mm wide by about 0.38 mm long and about 0.1 mm in thickness or about 1/50th the size of a small, conventional chip. Also, the invention is not limited to laser chips 10 or even to solid state chips. Article 10 could as well be any article having regular sides with top edges for engaging a pickup head and bottom edges for registering to a site. For example, article 10 could even have a disc-like configuration with substantially continuous sides having top and bottom edges.

Chip Bonding

FIG. 1 shows typical apparatus for registering and bonding chips to a site. A component 23 (such as a threaded stud) is mounted in a fixture designated generally by the numeral 24. Fixture 24 includes a heater 25 surrounded by a shield 26 to protect an operator from burn injuries. Heater 25 is mounted to a top plate 28 on a two-way mechanical slide 30 which is mounted to a fixed base 31. A bottom plate 32 of slide 30 moves along a joint 33, in an X—X direction, extending from left to right of an operator, i.e., in and out of the paper containing FIG. 1. Walss 34 (only one shown) on plate 32 contain a plate having a handle 35 to move plate 28 and all items supported thereon in a Y—Y direction to and from an operator.

An ultrasonic generator 38, called a bonder 38, may be supported on a two-way slidable base although a fixed base 39 is normally preferred. Bonder 38 generates vibrations with ultrasonic frequency at a fixed end of a generally, horizontally extending, coupling member 40. In the art, member 40 is called a horn 40 and it reciprocates in a compression mode according to arrow 41. At the front of slide 30, there is a mechanism operated by a hand member 42 which makes very small X and Y adjustments to the slide 30, the fixture 24 and the site on component 23, relative to the bonder horn 40. A lever 43 makes small Z movements to the free end of horn 40.

A tool 44 for pickup and engagement of a chip 10 is shown affixed to the free end of horn 40. Such a tool is often referred to in bonding as a head, a collet or a chuck. A similar tool called a head is used in removing chips from an adhesive web or from a reflecting surface for intermediate operations such as testing. Many of these tools, especially when improved according to the invention, are useful for bonding, testing and other operations so such tools will be referred to herein as heads 44.

Head 44 has an elongated, often cylindrical body such that horn 40 may be formed to include an aperture (not seen in FIG. 1) for placement of head 44 in its free end. A slightly chamfered upper portion of the body is provided so head 44 is slipped into the aperture and a set screw 45 is tightened to close the split and secure head 44. A tube 47 is slipped over the upper portion of head 44 and vacuum is drawn therethrough from a source (not shown) according to arrow 46.

The chip 10 is so tiny and a bonding site on component 23 is so finely prepared that major magnification (about 30× to 100×) is required to view and control the work. A microscope 48 is provided in a fixed position in space so that at least one eyepiece 49 is located well above a workplane 50 which passes across a working face at the lower end of head 44. Such eyepiece 49 is even further above the lever 43 and hand member 42 utilized to produce relative motion between a chip 10 and a site. More important, the fixed position of microscope 48 provides a very restrictive viewing field because an operator cannot readily move from the eyepiece 49 while manipulating hand member 42 or lever 43. Between a sight line 51 and the workplane 50, an angle A is formed which is typically about 54° to 58° for an operator of average dimensions.

Additional aid may be provided for registering a chip 10 to a site including a CCTV camera (not shown). Such a camera may be aimed to provide a nearly orthogonal side view of the work, such as a left side view selected with respect to an operator who faces the work according to arrow 52. The view may be displayed on a TV monitor 54 shown at about the height of eyepiece 49 and on or about the centerline of component 23 in FIG. 1. Monitor 54 shows with about 100× enlargement (from object to screen), a wall 55 of the component 23 in which cut out portions 56 are made to isolate a pedestal 20. The head 44 is also shown holding a chip 10 such that a portion protrudes for registering and bonding to the pedestal 20.

Prior Art Heads

Expedients for orienting and holding a chip 10 will be better explained with reference to FIGS. 2A, 3, 2B and 2C showing prior art heads 58 and 60 for bonding a chip 10. FIG. 2A shows, at a scale of about 60 to 1, a bottom view of head 58 featuring a working face 59 defined by the outermost rectangle shown. Head 58 has a cylindrical body 61, typically about 0.06 inches in diameter, but its periphery cannot be shown because of the large scale. From such periphery to the working face 59, tapered surfaces 62, 63, 64 and 65 are provided, usually by grinding because body 61 is typically made of a very hard material such as tungsten carbide.

In the working face 59, a cavity 66 is formed by walls 67, 68, 69 and 70 having respective, inwardly and upwardly inclined surfaces 71, 72, 73 and 74. Surfaces 71–74 are for engaging corresponding top edges of sides 12–15 of a chip 10 shown in outline in FIG. 2A and shown solidly to the extent possible in FIGS. 2B and 4B. Surfaces 71–74 are converged to a bore 75 extending through the body 61, as seen in FIG. 2B, and adapted for connection to a vacuum source as described for FIG. 1. It is desirable that the vacuum source as applied through bore 75 to cavity 66 be of sufficient strength to hold chip 10 against surfaces 71–74 during a vibratory bonding operation. Other expedients and mechanisms, for example, an electromagnet, may also hold a chip 10 having metallized layers or surfaces which are magnetic.

Head 58 is typical of a popular head for pickup and handling of articles having regular sides and delicate surfaces. Such heads became publicly available early in the 1960-1970 decade and have found acceptance in the solid state industry. The heads virtually eliminate damage to top surfaces, they accommodate to variable thickness in articles, and they automatically center and maintain orientation of articles. The heads are also adaptable to testing, to bonding operations, and to article removal from adhesive webs.

Figure 3:
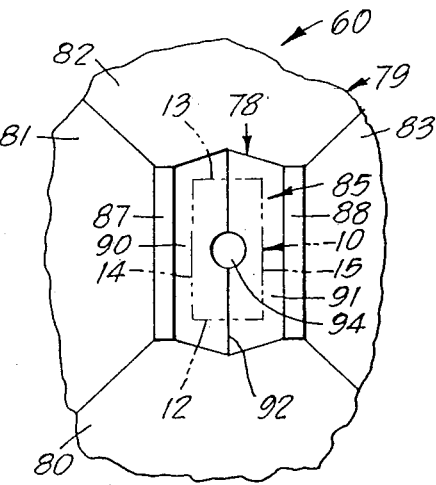
FIG. 3 is a bottom view of another prior art bonding head showing its working face.

FIG. 3 shows, at a scale of about 60 to 1, a bottom view of a head 60, featuring a working face 78 defined by outer vertical lines which are connected at each end by angular lines. Head 60 has a cylindrical body 79 of about the same diameter as body 61 of head 58 and having a similar periphery too large to show at 60/1 scale. From such periphery to the working face 78, tapered surfaces 80, 81, 82 and 83 are provided, usually by grinding because of hardness of the material used for the body 79 (as explained for head 58).

In the working face 78, a cavity 85 is formed, at least by walls 87 and 88 having respective inwardly and upwardly inclined surfaces 90 and 91. Surfaces 90 and 91 are for engaging corresponding top edges 14 and 15 of a chip 10 shown in outline in FIG. 3 and explained previously. Note (unlike head 58), that surfaces 90 and 91 meet along a line 92 which extends through a vacuum bore 94. Vacuum bore 94 is adapted for connecting to a vacuum source for engaging and holding a chip 10. It will be appreciated that considerable air leaks into the ends of cavity 85 so the vacuum source must be capable of moving more air than for head 58. Nevertheless, it is found that readily available vacuum pumps may provide sufficient vacuum for holding a chip 10 in a head 60.

The reason head 60 has only two engagement surfaces is primarily to avoid applying engagement stresses to the short sides 12 and 13 of a laser chip 10 where windows 22 are located. A further advantage is that such a laser chip can be more readily tested in head 60 because there are no end walls. Light from the windows 22 tends to fan out and become disrupted by end features such as the end walls 67 and 69 in head 58. However, head 60 has the same viewing problems which are evident for head 58 and which will now be explained for head 58 utilizing FIGS. 2B and 2C.

FIG. 2B is a side elevation of head 58 showing certain internal features for description. Note that the top edges of chip 10 are engaged to corresponding surfaces in the cavity 66 and respective bottom edges of chip 10 are available for comparing to the edges of a topside 95 of pedestal 20. Topside 95 will often be described herein as a site 95 to which chip 10 will be registered. Typically, the dimensions of cavity 66 are selected so chip 10 is engaged with about one-half its thickness protruding from working face 59.

The workplane 50 is shown, extending across the working face 59 at a height of about 6–8 mils above site 95 for searching, comparing and registration purposes. A typical sight line 51 is shown extending from an elevated, fixed microscope (not shown) and forming an angle A with workplane 50.

Figure 2C:
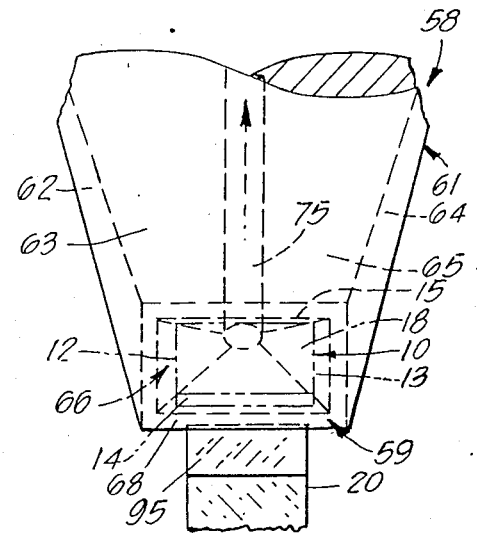
FIG. 2C is an operator's view (a front oblique view) of the head shown in FIG. 2B, taken along line 2C—2C.

FIG. 2C is a front, auxiliary view of head 58 taken along line 2C—2C, as shown in FIG. 2B, i.e., FIG. 2C is an oblique, foreshortened view as seen by an operator looking downward along line 51. FIGS. 2B and 2C show that chip 10 is completely hidden from a viewing field of an operator by front wall 68 facing the operator at cavity 66.

Pedestal 20 has a topside 95 which is about 7.5 mil wide by about 14 mils long so that all edges of chip 10 overhang the site. Note that site 95 of pedestal 20 is also partially hidden in FIG. 2C due to the line of sight 51 compared to the clearly open, orthogonal view seen in FIG. 2B. It is apparent from FIG. 2C, that an operator estimates the position of a chip 10 in the cavity 66 of the head 58. Then the front wall 68 is centered on site 95 by comparing the portions extending on either side of pedestal 20. As the distance between working face 59 and surface 95 is closed, such comparison becomes more certain but such relative comparing cannot compare with direct viewing of chip 10. It has been determined that a line of sight somewhat approaching line 96 in FIG. 2B is desirable to achieve direct comparison of chip 10 to the site 95.

New Heads

FIG. 4A is a bottom view of a head 158 similar to head 58 shown in FIGS. 2A, 2B and 2C but including modifications made in accordance with one embodiment of the invention. FIG. 4B is a front, auxiliary view of an upright head 158, taken in the same manner as the view of head 58 in FIG. 2C, i.e., FIG. 4B is an oblique, foreshortened view as seen by an operator looking downward along a sight line such as line 51 in FIG. 2B.

FIG. 4A shows head 158 with a working face 159 defined similarly to head 58 except that two front corner portions have been removed (or omitted) from recesses 100 and 102 (FIGS. 4A and 4B). Recess 100 has been formed by grinding away a prism shaped portion (FIG. 4A) represented by a new tapered surface 104 extending to line 106 which cuts across cavity 166. The prism is further outlined by phantom lines indicating former intersections between tapered surfaces 163 and 164 and the removed outside edges of portions of walls 168 and 169. Recess 102 is similarly formed by removing (or omitting) a prism portion similarly represented by a new tapered surface 108 extending to a line 110 and phantom lines indicating former features.

Head 158 has a cylindrical body 161 of about the same diameter as body 61 of head 58 and having a similar periphery too large to show at 60/1 scale. From such periphery to the working face 159, tapered surfaces 162, 163, 164 and 165 are provided as explained for head 58.

In the working face 159, a cavity 166 is formed by walls 167, 168, 169 and 170 having respective inwardly and upwardly inclined surfaces 171, 172, 173 and 174 converging to a vacuum bore 175. Surfaces 171–174 are for engaging corresponding top edges of sides 12–15 of a chip 10 shown in outline in FIG. 4A.

The advantages of head 158 are immediately apparent by reference to FIG. 4B in contrast to FIG. C. Recesses 100 and 102 are sufficient to reveal to an operator, with or without magnification, features of article 10 for comparing directly with site 95. By a recess it is meant an inwardly removed (or omitted) item such as resembles a cleft or indentation which reveals sufficient of a feature of an article 10 that one can compare the revealed feature to a corresponding feature of a site. There need be only one recess and only one revealed feature. For example, an operator would be greatly aided by having only recess 100 which reveals a front bottom edge of article 10 extending to a right front corner. The front, bottom edge could be compared with the front edge of site 95. The right front corner could be compared with the right, front corner of site 95.

The recesses are formed primarily to reveal bottom edges of an engaged article sufficient for registering such edges and the article to a site. When a fixed microscope is used for registering, the viewing field becomes much more restricted as explained in FIG. 2B and shown in FIG. 2C. From an eyepiece, an article engaged in a cavity is at least partially hidden from a viewing field, even to a very short operator. In such case, at least some portion of the view-obstructing front wall should be recessed and such recess should be selected with respect to the viewing field. Such a recess is desirably located at an end portion of the front wall and should reveal to an operator sufficient bottom edges of article 10, preferably extending to at least one corner of the article for registration to a site. The presently preferred embodiment for chip 10 is shown in FIG. 4B where front-to-back and side-to-side alignment is achieved at two corners which are readily seen by an operator.

Though significant portions of walls 167, 168 and 169 are removed (FIG. 4A) the remaining walls provide surprising strength for restraining a chip, even during a strenuous operation. For example, over one-half of walls 167 and 169 are removed to obtain a sight angle A moved back to line 96 as illustrated in FIG. 2B. Also, about 60–80% of the front wall 168 has been removed to expose the corners of article 10. Yet a portion 113, which is the intermediate portion of front wall 168 remaining, is of sufficient strength that it withstands forces transferred along its surface 172 even during a bonding operation. For example, such forces may be of the type generated by vibrating the engaged chip 10 sufficiently against site 95 to bond the chip to the pedestal 20.

FIG. 5A is a bottom view of a head 160, similar to the head 60 shown in FIG. 3 but including modifications made in accordance with the invention. FIG. 5B is a side elevation of an upright head 160 and FIG. 5C is a front, auxiliary view of the upright head 160 taken along lines 5C—5C in FIG. 5B. FIG. 5C is an oblique, foreshortened view as seen by an operator looking down along a sight line 151 (FIG. 5B), similar to sight line 51 seen in FIG. 2B.

FIG. 5A shows head 160 with a working face 178 defined by outside edges of walls 187 and 188 and angular lines connecting such edges at each end. Two front corner portions have been removed to form recesses 112 and 114 (FIGS. 5A—5C). Recesses 112 and 114 have been formed by grinding away a somewhat prism shaped portion (FIG. 5A) represented by a new tapered surface 116 extending to a line 118 which cuts across cavity 185. The prism is further outlined by phantom lines indicating former intersections between tapered surfaces 181 and 182 and the removed outside edges of wall 187 and surface 190. Recess 114 is similarly formed by removing a somewhat prism shaped portion similarly represented by a new tapered surface 120 extending to a line 122 and phantom lines indicating former features.

Head 160 has a cylindrical body 179 about 0.06 inches in diameter and having a periphery as shown in FIG. 5A. From such periphery to the working face 178, major tapered surfaces 180, 181, 182 and 183 are provided as for head 60.

In the working face 178, a cavity 185 is formed by a front wall 187 and a back wall 188 having respective inwardly and upwardly inclined surfaces 190 and 191. Surfaces 190 and 191 are for engaging top edges of long sides 14 and 15 of a chip 10 shown in outline in FIG. 5A. Surfaces 190 and 191 meet along a line 192 which extends through a vacuum bore 194. Vacuum bore 194 is adapted for connection to a vacuum source similar to that described for head 60.

It will be appreciated that there are only two walls having two engagement surfaces for holding an article 10 in head 160. There are no end walls at all and no end engagement surfaces to obstruct light during a testing operation. The front wall 187 has a portion 124 remaining after about 60–80% is removed (or omitted) to expose the corners of the chip 10 for registration to a site. Yet it has been found that a chip 10 is held with proper orientation and sufficient strength during handling, testing and/or ultrasonic bonding.

FIG. 5B shows that recess 112 (its counterpart recess 114 is hidden) does a fine job of exposing chip 10 at least to a line 196 which extends parallel to sight line 151. Note that chip 10 is engaged by only its top edges along sides 14 and 15 so surface 18 is not endangered. Note also, that there are no obstructing head features near where end windows 22 will emit light during testing.

FIG. 5C shows well the advantages experienced by an operator who views head 160 aong siqht line 151 while registering a chip 10 for a bonding operation. The recesses 112 and 114 are sufficient with respect to the viewing field to reveal to the operator, bottom edges of chip 10 extending to the front corners. Of course, the human eye does not see a truly orthogonal view even from an auxiliary plane such as taken along line 5C—5C in FIG. 5B. What is seen is a slightly perspective view (not shown in FIG. 5C) which includes barely discernible side features of head 160. When recesses are formed sufficiently into such sides, the bottom edges along the sides of an article 10, extending to front corners, are also seen by an operator. Such edges and such corners are directly compared with corresponding edges and corners of topside 95 of pedestal 20. It is incidentally seen that even topside 95 i.e., site 95, is more readily viewed by utilizing recesses according to one embodiment of the invention. Moreover, it is evident that site 95 will remain more viewable as head 160 is lowered onto pedestal 20 to register, test and/or bond chip 10 to site 95.

Figure 6A:
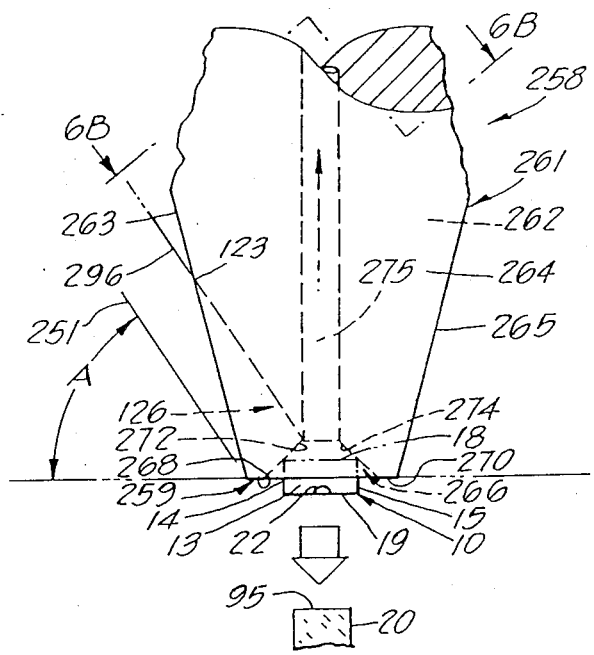
FIG. 6A is a side elevation of a head such as that shown in FIG. 2A but having a niche type of recess.
Figure 6B:
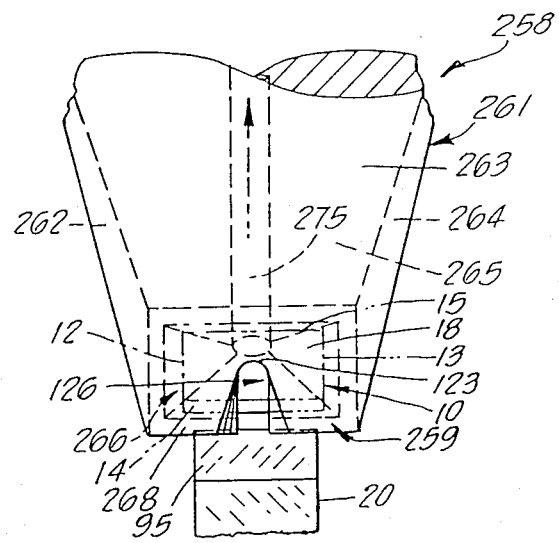
FIG. 6B is an operator's view of the head shown in FIG. 6A (taken along line 6B—6B) showing edges of a chip revealed by a niche in a front wall.

FIGS. 6A and 6B show a head 258, similar to head 58 shown in FIG. 2A, but including other modifications made in accordance with one embodiment of the invention. FIG. 6A is a side elevation of an upright head 258 ready for bonding and FIG. 6B is a front, auxiliary view of the upright head 258, taken along lines 6B—6B in FIG. 6A. FIG. 6B is an oblique, foreshortened view as seen by an operator looking down along a sight line 251 (FIG. 6A) similar to sight line 51 seen in FIG. 2B.

Features of head 258 which are similar to those of head 58 have a numeral #2 affixed to the designation of the similar feature; for example, the body similar to body 61, is designated body 261.

There is provided along a line 296, an intermediate recess 126 in the front face 263 of head 258. Recess 126 is in the form of an indentation which will be further referred to as a niche 126. The niche 126 begins at point 123 in FIG. 6A and extends to surface 272 of cavity 266.

FIG. 6B shows niche 126 as seen by an operator. Note that niche 126 reveals a front intermediate portion of chip 10 including a portion of top surface 18, long side 14 and the bottom edges. Niche 126 also reveals a rear portion of site 95, not seen in FIG. 2C. Niche 126 is of aid in establishing front-to-back alignment which has been difficult to achieve in the prior art as seen in FIG. 2C. Of course, side-to-side alignment is achieved by comparing side portions of front wall 268 to the pedestal 20.

General Discussion

It has been mentioned that from 50 to 80% of various walls of a head 58 may be removed for viewing without impairing the orienting and engaging function. Even in a head 60, which has only two walls for orienting and engaging, 60 to 80% of a front wall may be removed for viewing without impairing these important functions. These results seem surprising because one normally gives great weight to the wall portions having rectangular, bottom surfaces which are nearly coplanar with workplanes 50 and 150 seen in FIGS. 2B and 5B, respectively. Such portions were believed necessary to curtail lateral movement of an article until it was seated in the manner shown in the figures. Actually, it is found that very little of such wall portions are needed to curtail lateral excursions until an article is seated. Moreover, if one examines the cavities 166 and 185 of heads 158 and 160, respectively, it is apparent that the percentages of walls excluded pertain more particularly to the rectangular surface portions in the working planes than to the engaging surfaces. Actually, very little of the inwardly inclined engaging surfaces are removed (or omitted) by altering the wall design. Accordingly, the holding and orienting functions of such heads is little different than the prior art heads.

It will be appreciated that X—X and Y—Y motions are produced to align an article 10 to a cavity of a head for pickup of an article. Thereafter, similar motion and Z—Z (vertical) motion is produced to register an article 10 and to bond a chip 10 to a site 95. It was shown by reference to FIG. 1, that X—X and Y—Y motion may be produced by moving parts of a slide 30 in fixture 24 or by replacing a base 39 with a base having a two-way slide, under bonder 38. For pickup or bonding, fixture 24 may be adapted for vertical movement. For bonding, it is customary to provide the leveraged mechanism operated by lever 43 to lower the free end of horn 40 and exert a calibrated pressure through a head 44 to a chip 10 and a site.

Heads of the prior art, such as heads 5B and 60 may be made of materials such as heat treated steel, ceramic, titanium carbide and tungsten carbide to resist wear from articles to be engaged. Such heads are routinely supplied by Pine Valley Precision, Inc. of Pennsauken, N.J. with a typical elongated body about 0.0625 inch diameter by 0.75 inch long. Electronic oscillators and mechanical transducers with automatic frequency control and coupling horns are utilized to vibrate chip 10 at about 60 kilohertz. Typical apparatus is sold by Orthodyne Electronics, Inc. of Costa Mesa, Calif. as its Model 363A-211.

For bonding articles 10, a downward force upon such articles and sites 95 ranges from 0 to about 100 grams but may range from about 15 to about 60 grams ior laser chips. Also, a component 23 may be heated to about 120°–130° C. by an electric cartridge heater 25 for some types of vibratory bonding but for others no heating is required.

A vacuum source may provide about 5 psia in a head 158 or 160 in the practice of the invention. Such source should be able to move from about 0.06 to about 0.12 CFM of air while engaging a chip 10 and drawing air through clearance spaces.

Such apparatus information and operating conditions are offered to enable one to readily practice the invention. However, it is to be understood that no such information is limiting to the invention which may be practiced by other apparatus known in the art and under other conditions.

There have been illustrated herein certain practical embodiments and applications of the invention. Nevertheless, it is to be understood that various modifications and refinements may be made and used which differ from the disclosed embodiments without departing from the spirit and scope of the present invention.

What is claimed is:

1. A head for registering an article to a site, said article containing a plurality of sides having top edges for engaging the head and bottom edges for registering to the site, comprising:
    a body having an upper portion adapted for support a plurality of exterior surfaces and a lower portion terminating in a downwardly presented, working face;
    in said face, a cavity formed by a plurality of walls having inwardly and upwardly directed interior surfaces for engaging corresponding top edges of the article such that said article is at least partially disposed within said cavity;
    means in said cavity adapted for removably engaging said article to said engaging surfaces; and
    at least one of said walls having a portion at least equal to half of said wall but less than eighty percent of said wall which is sufficiently recessed such that a prism shaped channel extends from said exterior surface to said interior surface of said cavity to reveal bottom edges of an engaged article for registering such edges and the article to a site.

2. A head as in claim 1 wherein said body is supported in such a position that an article engaged to surfaces in the cavity is at least partially hidden from a viewing field of an operator by a front wall facing the operator, at the cavity, further comprising:
    said front wall having at least one end portion recessed sufficiently with respect to said viewing field to reveal to said operator, bottom edges of said article extending to at least one corner of the article for registering the article to a site.

3. A head as in claim 2 wherein the cavity is formed at least by the front wall and a back, substantially parallel, opposing wall for engaging an article therebetween, further comprising:
    said front wall having two end portions recessed and an intermediate portion remaining of sufficient strength to withstand forces transferred thereto by vibrating the engaged article sufficiently against a site to bond the article to the site.

4. Bonding apparatus having improved registration of an article to a site, said article having substantially flat upper and lower surfaces and a plurality of sides forming top edges for engaging the apparatus and, extending to respective corners of the article, bottom edges for registering to the site, comprising:
    a body having an upper portion adapted for support, a plurality of exterior surfaces and a lower portion terminating in a downwardly presented working face;
    in said face, a cavity formed by a plurality of walls having inwardly and upwardly directed interior surfaces for engaging a corresponding plurality of top edges of the article sufficiently to hold said article in a desired position at least partially within said cavity;
    means for communicating with said cavity for removably engaging said article to said engaging surfaces; and
    at least one recess formed in a wall, said recess forms a prism shaped channel that extends from said exterior surface to said interior surfaces of said cavity, said recess being equal to at least half to said wall but less than eighty percent of said wall, sufficient to reveal bottom edges of an engaged article, said revealed edges extending to at least one corner of the article for registering the article to the site.

5. Apparatus as in claim 4, further comprising:
    means for supporting said body such that an article engaged to surfaces in the cavity is at least partially hidden from a viewing field of an operator by a front wall of the cavity facing the operator, further comprising:
    said front wall having at least one end portion recessed sufficiently with respect to said viewing field to reveal to said operator, bottom edges of said article extending to at least one corner of the article for registering the article to a site.

6. Apparatus as in claim 5 wherein the cavity is formed at least by the front wall and a back, substantially parallel, opposing wall for engaging an article therebetween, further comprising:
    a recess formed in each respective end portion of the front wall and an intermediate portion remaining of sufficient strength to withstand forces transferred thereto by vibrating the engaged article sufficiently against a site to bond the article to the site.

7. Apparatus as in claim 6 wherein the article is a solid state chip having four sides and, in its top surface, features which may be damaged by mechanical contact, further comprising:
    the cavity formed by a front, a back, and two side walls having inwardly and upwardly converging surfaces adapted for engaging respective upper edges of the four sides of the chip sufficiently to hold such chip with a desired orientation and with a lower portion of said chip protruding from the working face of the body; said means for engaging the chip further including:
    a bore in the body adapted for communicating between said cavity and a vacuum source of sufficient strength to hold the chip against the engaging surfaces during a vibratory bonding operation; and
    said recesses in said end portions of said front wall extending into said side walls of the cavity to reveal in said viewing field, sufficient bottom edges at the front and sides of the chip for registering said chip to a site.

8. Apparatus as in claim 7 wherein the bonding site is on a component held in a bonding fixture and wherein the means for supporting the body and the registering further comprise:
    a horizontally extending coupling member having a free end connected to the body and a fixed connected to a bonder for imparting ultrasonic vibrations to the member, the body and the chip; and
    means for producing relative motion between the bonder and the fixture for comparing bottom edges at corners of the chip held in the body to the site on the component in the fixture for registering and bonding the chip to the site.

9. A method of registering an article to a site for bonding, said article having substantially flat upper and lower surfaces and a plurality of sides forming top edges for engaging the apparatus and, extending to respective corners of the article, bottom edges for registering to the site, comprising:

supporting a body by connection of an upper portion of the body such that a lower portion terminates in a downwardly presented working face;

producing relative motion between said body and an article to align said article to a cavity formed in said face by a plurality of walls, said walls having inwardly and upwardly directed interior surfaces for engaging a corresponding plurality of top edges of the article sufficiently to hold said article in a desired position at least partially within said cavity and said walls having outwardly directed exterior surfaces which correspond to the exterior surfaces of said body;

removably engaging said aligned article utilizing means communicating with said cavity for engaging said article to said engaging surfaces; and comparing with the site, bottom edges of the engaged article revealed by a recess formed in a portion of a wall of the cavity, said recess forms a prism shaped channel that extends from said exterior surface to said interior surface of said cavity, said recess being equal to least half of said wall but less than eighty percent of said wall, said revealed edges extending to at least one corner of the article for registering the article to the site.

10. A method as in claim 9, wherein the supporting and comparing steps further comprise:

supporting said body such that an article engaged to surface in the cavity is at least partially hidden from a viewing field of an operator by a front wall of the cavity facing the operator, further comprising:

comparing the site with the article along at least one end portion of said front wall, said portion being recessed sufficiently with respect to said viewing field that there is revealed to said operator, bottom edges of said article extending at least to one corner of the article for registering the article to a site.

11. A method as in claim 10 wherein the cavity is formed at least by the front wall and a back, substantially parallel, opposing wall for engaging an article therebetween, the comparing step further comprising:

comparing the article with the site at recesses formed in respective end portions of the front wall, an intermediate portion of said front wall remaining, said intermediate portion having sufficient strength to withstand forces transferred thereto by vibrating the engaged article sufficiently against a site to bond the article to the site, 12. A method as in claim 11 wherein the article is a solid state chip having four sides and, in its top surface, features which may be damaged by mechanical contact, the motion producing step, the removably engaging step and the comparing step further comprising:

aligning said article to said cavity formed by a front, a back, and two side walls having inwardly and upwardly converging surfaces adapted for engaging respective upper edges of the four sides of the chip sufficiently to hold such chip with a desired orientation and with a lower portion of said chip protruding from the working face of the body;

applying to said cavity, through a bore in the body, vacuum of sufficient strength to hold the chip against the engaging surfaces during a vibratory bonding apparatus; and comparing the article to the site at said recesses in said end portions of said front wall, said recesses being extended into said side walls of the cavity to reveal in said viewing field, sufficient bottom edges at the front and sides of the wafer to register said wafer to a site.

13. A method as in claim 12 wherein the site for bonding is on a component held in a fixture and wherein the step of supporting the body, the registering and the bonding further comprise:

connecting the body to a free end of a coupling member having a fixed end connected to a bonder capable of developing vibrations with ultrasonic frequency;

producing relative motion between the bonder and the fixture for comparing bottom edges at corners of the chip held in the body, to the site on the component held in the fixture, until a desired registration is achieved; and transmitting from the bonder, ultrasonic vibrations to the member, the body and the chip for bonding the chip to the site.

* * * * *